(12) United States Patent
David et al.

(10) Patent No.: US 9,102,083 B2
(45) Date of Patent: Aug. 11, 2015

(54) METHODS OF FORMING MOLDS AND METHODS OF FORMING ARTICLES USING SAID MOLDS

(75) Inventors: Moses M. David, Woodbury, MN (US); Guoping Mao, Woodbury, MN (US); Olester Benson, Jr., Woodbury, MN (US); Robert J. DeVoe, Arden Hills, MN (US); Jennifer J. Sahlin, Minneapolis, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 539 days.

(21) Appl. No.: 12/675,217

(22) PCT Filed: Sep. 5, 2008

(86) PCT No.: PCT/US2008/075392
§ 371 (c)(1),
(2), (4) Date: Feb. 25, 2010

(87) PCT Pub. No.: WO2009/033017
PCT Pub. Date: Mar. 12, 2009

(65) Prior Publication Data
US 2010/0308509 A1    Dec. 9, 2010

Related U.S. Application Data

(60) Provisional application No. 60/967,632, filed on Sep. 6, 2007.

(51) Int. Cl.
*B29C 59/16* (2006.01)
*B29C 33/58* (2006.01)
(Continued)

(52) U.S. Cl.
CPC .............. *B29C 33/58* (2013.01); *C23C 16/401* (2013.01); *G02B 1/118* (2013.01); *B29C 33/3857* (2013.01); *B29C 33/405* (2013.01); *B29K 2083/005* (2013.01); *B29K 2105/0082* (2013.01)

(58) Field of Classification Search
USPC ........................................................ 264/225
See application file for complete search history.

(56) References Cited

U.S. PATENT DOCUMENTS

| 3,018,262 A | 1/1962 | Schroeder |
| 3,729,313 A | 4/1973 | Smith |

(Continued)

FOREIGN PATENT DOCUMENTS

| EP | 0841140 | 5/1998 |
| EP | 0856592 | 8/1998 |

(Continued)

OTHER PUBLICATIONS

Polycarbonate Tg (web page evidence for properties).*

(Continued)

*Primary Examiner* — Yogendra Gupta
*Assistant Examiner* — Kimberly A Stewart
(74) *Attorney, Agent, or Firm* — Eric E. Silverman

(57) ABSTRACT

A method of forming a working mold including: placing a substrate (610) on an electrode in a chamber, the substrate having at least a first structured surface (620) and the substrate including a thermoset polymeric material; introducing a release (630) layer forming gas into the chamber, wherein the release layer forming gas includes silicon containing gas and oxygen gas in an atomic ratio of not greater than about 200; providing power to the electrode to create a plasma of the release layer forming gas within the chamber; and depositing a release layer formed from the release layer forming gas on at least the first structured surface of the substrate to form a working mold.

10 Claims, 4 Drawing Sheets

(51) Int. Cl.
*C23C 16/40* (2006.01)
*G02B 1/118* (2015.01)
*B29C 33/38* (2006.01)
*B29C 33/40* (2006.01)
*B29K 83/00* (2006.01)
*B29K 105/00* (2006.01)

(56) References Cited

U.S. PATENT DOCUMENTS

| | | | |
|---|---|---|---|
| 3,741,769 A | 6/1973 | Smith | |
| 3,779,778 A | 12/1973 | Smith | |
| 3,808,006 A | 4/1974 | Smith | |
| 4,159,292 A * | 6/1979 | Neefe | 264/2.3 |
| 4,249,011 A | 2/1981 | Wendling | |
| 4,250,053 A | 2/1981 | Smith | |
| 4,262,072 A | 4/1981 | Wendling | |
| 4,279,717 A | 7/1981 | Eckberg | |
| 4,394,403 A | 7/1983 | Smith | |
| 4,491,628 A | 1/1985 | Ito | |
| 4,642,126 A | 2/1987 | Zador | |
| 4,652,274 A | 3/1987 | Boettcher | |
| 4,668,601 A | 5/1987 | Kistner | |
| 4,681,653 A * | 7/1987 | Purdes et al. | 438/695 |
| 4,778,721 A * | 10/1988 | Sliemers et al. | 428/336 |
| 4,859,572 A | 8/1989 | Farid | |
| 5,148,010 A | 9/1992 | Mori | |
| 5,235,015 A | 8/1993 | Ali | |
| 5,298,741 A | 3/1994 | Walt | |
| 5,369,511 A | 11/1994 | Amos | |
| 5,384,238 A | 1/1995 | Ellis | |
| 5,512,219 A | 4/1996 | Rowland | |
| 5,545,676 A | 8/1996 | Palazzotto | |
| 5,679,413 A * | 10/1997 | Petrmichl et al. | 427/534 |
| 5,718,497 A | 2/1998 | Yokoyama | |
| 5,753,346 A | 5/1998 | Leir | |
| 5,770,737 A | 6/1998 | Reinhardt | |
| 5,837,314 A * | 11/1998 | Beaton et al. | 427/133 |
| 5,856,373 A | 1/1999 | Kaisaki | |
| 5,858,624 A | 1/1999 | Chou | |
| 5,859,251 A | 1/1999 | Reinhardt | |
| 5,998,495 A | 12/1999 | Oxman | |
| 6,025,406 A | 2/2000 | Oxman | |
| 6,100,405 A | 8/2000 | Reinhardt | |
| 6,215,095 B1 | 4/2001 | Partanen | |
| 6,262,140 B1 | 7/2001 | Savant | |
| 6,288,842 B1 | 9/2001 | Florczak | |
| 6,316,153 B1 | 11/2001 | Goodman | |
| 6,560,248 B1 | 5/2003 | Vernackt | |
| 6,565,776 B1 | 5/2003 | Li | |
| 6,674,572 B1 | 1/2004 | Scheruebl | |
| 6,696,157 B1 | 2/2004 | David | |
| 6,713,772 B2 | 3/2004 | Goodman | |
| 6,750,266 B2 | 6/2004 | Bentsen | |
| 6,804,062 B2 | 10/2004 | Atwater | |
| 6,852,766 B1 | 2/2005 | DeVoe | |
| 6,855,478 B2 | 2/2005 | DeVoe | |
| 6,887,420 B2 | 5/2005 | Heilig | |
| 6,949,272 B2 | 9/2005 | Wochnowski | |
| 6,986,857 B2 * | 1/2006 | Klemm et al. | 264/219 |
| 7,026,103 B2 | 4/2006 | DeVoe | |
| 7,070,406 B2 | 7/2006 | Jeans | |
| 7,157,145 B2 | 1/2007 | Vissing | |
| 7,374,417 B2 | 5/2008 | Kuwabara | |
| 7,551,359 B2 | 6/2009 | Murnan | |
| 7,563,013 B2 | 7/2009 | Lin | |
| 7,583,444 B1 | 9/2009 | DeVoe | |
| 7,887,889 B2 | 2/2011 | David | |
| 7,893,410 B2 | 2/2011 | Sykora | |
| 8,109,665 B2 | 2/2012 | Lin | |
| 2002/0163619 A1 | 11/2002 | Matsuzawa | |
| 2002/0192569 A1 | 12/2002 | Ulland | |
| 2002/0197051 A1 | 12/2002 | Tamura | |
| 2003/0006535 A1 | 1/2003 | Hennessey | |
| 2003/0071016 A1 | 4/2003 | Shih | |
| 2003/0139484 A1 | 7/2003 | Bentsen | |
| 2003/0155667 A1 | 8/2003 | Devoe | |
| 2003/0164562 A1 * | 9/2003 | Li et al. | 264/1.32 |
| 2003/0175525 A1 | 9/2003 | Wochnowski | |
| 2004/0067431 A1 | 4/2004 | Arney | |
| 2004/0106278 A1 * | 6/2004 | Xu et al. | 438/637 |
| 2004/0119174 A1 * | 6/2004 | Hofmann et al. | 264/1.32 |
| 2004/0145915 A1 | 7/2004 | Kim | |
| 2004/0180210 A1 | 9/2004 | Vissing | |
| 2004/0182820 A1 | 9/2004 | Motowaki | |
| 2004/0202865 A1 | 10/2004 | Homola | |
| 2004/0223385 A1 | 11/2004 | Fleming | |
| 2004/0228112 A1 | 11/2004 | Takata | |
| 2005/0054744 A1 | 3/2005 | DeVoe | |
| 2005/0079295 A1 | 4/2005 | Schaepkens | |
| 2005/0120747 A1 | 6/2005 | Fujimoto | |
| 2005/0133954 A1 | 6/2005 | Homola | |
| 2005/0147918 A1 | 7/2005 | Weber | |
| 2005/0167894 A1 | 8/2005 | Shih | |
| 2005/0254035 A1 | 11/2005 | Frankel | |
| 2005/0271794 A1 | 12/2005 | DeSimone | |
| 2005/0272599 A1 | 12/2005 | Kramer | |
| 2005/0273146 A1 | 12/2005 | DeSimone | |
| 2005/0287771 A1 | 12/2005 | Seamons | |
| 2006/0046156 A1 | 3/2006 | Amako | |
| 2006/0051048 A1 | 3/2006 | Gardiner | |
| 2006/0157444 A1 | 7/2006 | Nakamura | |
| 2006/0226566 A1 * | 10/2006 | Kwak et al. | 264/40.1 |
| 2006/0231728 A1 | 10/2006 | Takamatsu | |
| 2006/0254894 A1 | 11/2006 | Jung | |
| 2006/0279025 A1 | 12/2006 | Heidari | |
| 2007/0018362 A1 | 1/2007 | Heidari | |
| 2007/0035843 A1 | 2/2007 | Cassarly | |
| 2007/0057031 A1 | 3/2007 | Lee | |
| 2007/0090278 A1 | 4/2007 | Botma | |
| 2007/0102844 A1 | 5/2007 | Simon | |
| 2007/0216049 A1 | 9/2007 | Rudmann | |
| 2007/0217181 A1 | 9/2007 | Chiu | |
| 2007/0264481 A1 | 11/2007 | DeSimone | |
| 2007/0271791 A1 | 11/2007 | Lai | |
| 2008/0007964 A1 | 1/2008 | Lin | |
| 2008/0036105 A1 * | 2/2008 | Campanelli et al. | 264/1.38 |
| 2008/0083886 A1 | 4/2008 | Faklis | |
| 2008/0106001 A1 | 5/2008 | Slafer | |
| 2008/0196664 A1 | 8/2008 | David | |
| 2008/0319404 A1 | 12/2008 | Pekurovsky | |
| 2009/0061039 A1 | 3/2009 | Zhang | |
| 2009/0099537 A1 | 4/2009 | DeVoe | |
| 2009/0163127 A1 | 6/2009 | David | |
| 2009/0175050 A1 | 7/2009 | Marttila | |
| 2009/0213466 A1 | 8/2009 | Murnan | |
| 2009/0250635 A1 | 10/2009 | Sykora | |
| 2009/0279321 A1 | 11/2009 | Marttila | |
| 2009/0284840 A1 | 11/2009 | DeVoe | |
| 2009/0285543 A1 | 11/2009 | Marttila | |
| 2010/0227272 A1 | 9/2010 | DeVoe | |
| 2010/0239783 A1 | 9/2010 | Mao | |
| 2010/0288614 A1 | 11/2010 | Ender | |
| 2010/0294954 A1 | 11/2010 | Gates | |
| 2010/0296106 A1 | 11/2010 | Gates | |
| 2010/0308497 A1 | 12/2010 | David | |
| 2010/0316959 A1 | 12/2010 | Gates | |
| 2011/0001950 A1 | 1/2011 | DeVoe | |
| 2011/0090142 A1 | 4/2011 | You | |

FOREIGN PATENT DOCUMENTS

| | | |
|---|---|---|
| JP | 52-822957 | 7/1977 |
| JP | 57-173160 | 10/1982 |
| JP | 60-160017 | 8/1985 |
| JP | 61-027212 | 2/1986 |
| JP | 02-022014 | 1/1990 |
| JP | 03-262608 | 11/1991 |
| JP | 10-034668 | 2/1998 |
| JP | 11-024081 | 1/1999 |
| JP | 2001/88138 | 4/2001 |
| JP | 2001-150451 | 6/2001 |
| JP | 2002-210860 | 7/2002 |
| JP | 2003-181843 | 7/2003 |

(56) References Cited

FOREIGN PATENT DOCUMENTS

| JP | 2004-358969 | 12/2004 |
|---|---|---|
| JP | 2005-041164 | 2/2005 |
| JP | 2005-512839 | 5/2005 |
| JP | 2005-515617 | 5/2005 |
| KR | 10-2002-0088146 | 11/2002 |
| KR | 10-2007-0068852 | 7/2007 |
| WO | WO 98/21521 | 5/1998 |
| WO | WO 99/53242 | 10/1999 |
| WO | WO 01/21374 | 3/2001 |
| WO | WO 01/96915 | 12/2001 |
| WO | WO 01/96952 | 12/2001 |
| WO | WO 01/96958 | 12/2001 |
| WO | WO 01/96961 | 12/2001 |
| WO | WO 02/05972 | 1/2002 |
| WO | WO 03/002269 | 1/2003 |
| WO | WO 2005/101466 | 10/2005 |
| WO | WO 2006/071914 | 7/2006 |
| WO | WO 2006/093963 | 9/2006 |
| WO | WO 2007/051803 | 5/2007 |
| WO | WO 2007/073482 | 6/2007 |
| WO | WO 2007/137102 | 11/2007 |

OTHER PUBLICATIONS

Polycarbonate thermoplastic thermoset (web page evidence for properties).*
Polymetylmethacrylate (web page evidence for properties).*
PolymerProcessing.com page, for evidence of polycarbonate Tg.*
"Microlenslet Array Based Magnifying System," Shaoulov, Breault Research Organization, Inc., Tucson, AZ, USA, [on line], [retrieved from the internet on Feb. 7, 2011], URL <www.breault.com/resources/kbasePDF/wp_spie_026_microlenslet_array.pdf>, 8 pages. (date unknown but believed to be prior to the date of filing of the priority application).
Anderson, "Close-up Imaging of Documents and Displays with Lens Arrays", Appl. Opt., Feb. 15, 1979, vol. 18, No. 4, pp. 477-484.
Baldacchini and Fourkas, "Fabrication and Metallization of Three-dimensional Microstructures", Materials Research Society Symposium Proceedings, 2004, vol. EXS-2, pp. M10.1.1-M10.1.3.
Beck, "Improving Stamps for 10 nm Level Wafer Scale Nanoimprint Lithigraphy", Microelectr. Eng., 2002, vol. 61-62, pp. 441-448.
Bongiovanni, "UV-curable Systems Containing Perfluoropolyether Structures: Synthesis and Characterization", Macromol. Chem. Phys., 1997, vol. 198, pp. 1893-1907.
Braun, "Polymer Replication of 3D Microstructures Employing a High Content Fluorine Separation Layer", Appl. Surf. Sci., 1999, vol. 138-139, pp. 206-211.
Dentinger, "Removal of SU-8 Photoresist for Thick Film Applications", Microelectronic Engineering, 2002, vol. 61-62, pp. 993-1000.
Duparre, "Artificial Compound Eyes—Different Concepts and Their Application to Ultra Flat Image Acquisition Sensors", MOEMS and Miniaturized Systems IV; Proceedings of SPIE, 2004, vol. 5346, pp. 89-100.
Duparre, "Microoptical Telescope Compound Eye", Optics Express, Feb. 7, 2005, vol. 13, No. 3, pp. 889-903.
Groning, "'Self-thickness-limited' Plasma Polymerization of an Ultrathin Antiadhesive Film", J. Vac. Sci. Tech. A., Nov./Dec. 1996, vol. 14, No. 6, pp. 3043-3048.
Hembd-Solner, "Imaging Properties of the Gabor Superlens", J. Opt. A: Pure Appl. Opt., 1999, vol. 1, pp. 94-102.
Hinsberg, "Effect of Resist Components on Image Spreading During Postexposure Bake of Chemically Amplified Resists", Advances in Resist Technology and Processing XVII; Proceedings of SPIE, 2000, vol. 3999, pp. 148-160.
Houle, "Antiadhesion Considerations for UV Nanoimprint Lithography", Applied Physics Letters, 2007, vol. 90, No. 213103, pp. 213103-1-213103-3.
Jaszewski, "Properties of Thin Anti-adhesive Films Used for the Replication of Microstructures in Polymers", Microelectr. Eng., 1997, vol. 35, pp. 381-384.

Jung, "Vapor-phase Self-assembled Monolayer for Improved Mold Release in Nanoimprint Lithography", Langmuir, 2005, vol. 21, pp. 1158-1161.
Kim, "A Simple Fabrication Route to a Highly Transparent Superhydrophobic Surface with a Poly(dimethylsiloxane) Coated Flexible Mold", Chem. Commun., 2007, pp. 2237-2239.
Lafratta and Fourkas, "Direct Laser Patterning of Conductive Wires on Three-dimensional Polymeric Microstructures", Chem. Mater., 2006, vol. 18, pp. 2038-2042.
Lee, "Antiadhesion Surface Treatments of Molds for High-Resolution Unconventional Lithography", Adv. Mater., 2006, vol. 18, pp. 3115-3119.
Lee, "Self-assembled Monolayer as an Antiadhesion Layer on a Nickel Nanostamper in the Nanoreplication Process for Optoelectronic Applications", Applied Physics Letters, 2006, vol. 88, No. 073101, pp. 073101-1-073101-3.
Maruo, "Three-dimensional Microfabrication with Two-photon-absorbed Photopolymerization," Opt. Lett., Jan. 15, 1997, vol. 22, No. 2, pp. 132-134.
Moon, Ford, and Yang, "Fabricating Three-dimensional Polymeric Photonic Structures by Multi-beam Interference Lithography", Polymers for Advanced Technologies, Feb. 2006, vol. 17, No. 2, pp. 83-93.
Park, "Fabrication of Nano-precision PDMS Replica Using Two-photon Photopolymerization and Vacuum Pressure Difference Technique", Bull. Korean Chem. Soc., 2004, vol. 25, No. 8, pp. 1119-1120.
Piestrup, "Large Area X-ray and Neutron Imaging Using Three-dimensional Arrays of Microlenses", Rev. of Sci. Inst., Nov. 2004, vol. 75, No. 11, pp. 4769-4774.
Shaoulov, "Compact Microlenslet-array-based Magnifier", Opt. Lett., Apr. 1, 2004, vol. 29, No. 7, pp. 709-711.
Shaoulov, "Magnifying Miniature Displays with Microlenslet Arrays", Helmet- and Head-Mounted Displays IX: Technologies and Applications; Proceedings of SPIE, 2004, vol. 5442, pp. 246-253.
Smith, Modern Optical Engineering: The Design of Optical Systems, 1966, pp. 104-105.
Tanaka, Ishikawa and Kawata, "Two-photon-induced Reduction of Metal Ions for Fabricating Three-dimensional Electrically Conductive Metallic Microstructure", Appl. Phys. Lett., 2006, vol. 88, pp. 81107-1-81107-3.
Wang, "Polybenzoxazine as a Mold-release Agent for Nanoimprint Lithography", Langmuir, 2007, vol. 23, pp. 5868-5871.
International Search Report for PCT/US2008/075392,Filing Date Sep. 5, 2008.
Allen, "193 nm Single Layer Positive Resists Building Etch Resistance into a High Resolution Imaging System", SPIE, 1995, vol. 2438, pp. 474-485.
Allen, "High Performance Acrylic Polymers for Chemically Amplified Photoresist Applications", J. Vac. Sci. Tech. B, Nov./Dec. 1991, vol. 9, No. 6, pp. 3357-3361.
Beringer, "Diaryliodonium Salts. IX. The Synthesis of Substituted Diphenyliodonium Salts", J. Am. Chem. Soc., 1959, vol. 81, pp. 342-351.
Chang, "A Roller Embossing Process for Rapid Fabrication of Microlens Arrays on Glass Substrates", Microsyst. Technol., Feb. 2006, vol. 12, pp. 754-759.
Eaton, "Dye Sensitized Photopolymerization", Advances in Photochemistry, 1986, vol. 13, pp. 427-487.
Korner, "New Approaches in Depth-scanning Optical Metrology", Proc. of SPIE, Apr. 1, 2004, vol. 5457, pp. 320-333, XP009084995.
Large, "The Use of Electrochemical Potential Data in Studies of Spectral Sensitization", Photographic Sensitivity, R.J. Cox, ed., Academic Press, Inc., Chapter 15, pp. 241-263, (1973).
Lee, Handbook of Epoxy Resins, McGraw-Hill, Inc. (1967).
Lel, "Local Thickness and Wave Velocity Measurement of Wavy Films with a Chromatic Confocal Imaging Method and a Fluorescence Intensity Technique", Experiments in Fluids, Nov. 1, 2005, vol. 39, pp. 856-864.
Li, "Multiphoton Polymerization", Materials Today, Jun. 2007, vol. 10, No. 6, pp. 30-37.
Mann, Electrochemical Reactions in Nonaqueous Systems, Marcel Dekker, Inc., (1970).

(56) References Cited

OTHER PUBLICATIONS

Peng, "High Fidelity Fabrication of Microlens Arrays by Nanoimprint Using Conformal Mold Duplication and Low-pressure Liquid Material Curing", J. Vac. Sci. Technol. B, Mar./Apr. 2007, vol. 25, No. 2, pp. 410-414.

Shi, "Chromatic Confocal Microscopy Using Supercontinuum Light", Optics Express, May 17, 2004, vol. 12, No. 10, pp. 2096-2101.

Weinberg, Techniques of Chemistry, vol. 5, Part II, Technique of Electroorganic Synthesis, John Wiley & Sons, Inc., (1975).

Xu, "Measurement of Two-photon Excitation Cross Sections of Molecular Fluorophores with Data from 690 to 1050 nm", J. Opt. Soc. Am. B, Mar. 1996, vol. 13, No. 3, pp. 481-491.

Zhou, "An Efficient Two-Photon-Generated Photoacid Applied to Positive-tone 3D Microfabrication", Science, May 10, 2002, vol. 296, pp. 1106-1109.

http://www.elmhurst.edu/-chm/vchembook/501 hcboilingpts.html "Hydrocarbon boiling points" accessed Jun. 26, 2013.

* cited by examiner

METHODS OF FORMING MOLDS AND METHODS OF FORMING ARTICLES USING SAID MOLDS

CROSS REFERENCE TO RELATED APPLICATIONS

This application is a national stage filing under 35 U.S.C. §371 of PCT/US2008/075392, filed 5 Sep. 2008, which claims priority to U.S. Provisional Patent Application No. 60/967,632, filed 6 Sep. 2007, the disclosure of which is incorporated by reference in its/their entirety herein.

FIELD

The present disclosure relates to methods of forming and utilizing molds.

BACKGROUND

Molds and molding processes have been extensively used and studied. The machine tool industry is capable of creating molds having a wide variety of detailed and useful patterns. Until recently molds were generally made from metal. Machining a metal mold to a customer's specifications can be a very time consuming process. The extensive time involved has lead the industry to investigate polymer molds. Polymer molds, although much quicker to manufacture can suffer from poor durability, poor release characteristics and transfer of material from the mold to the molded article. Polymer molds having better durability, release characteristics and minimal or no transfer of material from the mold are therefore desirable.

BRIEF SUMMARY

Disclosed herein is a method of forming a working mold including: placing a substrate on an electrode in a chamber, the substrate having at least a first structured surface and the substrate including a thermoset polymeric material; introducing a release layer forming gas into the chamber, wherein the release layer forming gas includes silicon containing gas or a mixture that includes silicon containing gas and oxygen gas in an atomic ratio of oxygen to silicon of not greater than about 200; providing power to the electrode to create a plasma of the release layer forming gas; and depositing a release layer formed from the release layer forming gas on at least a portion of the first structured surface of the substrate to form a working mold.

Also disclosed is a method of forming a working mold including: coating a master mold with a second generation precursor that includes crosslinkable material; forming an untreated working mold from the second generation precursor, the untreated working mold having at least a first structured surface and containing a thermoset polymeric material; placing the untreated working mold on an electrode in a chamber; introducing a release layer forming gas into the chamber, wherein the release layer forming gas includes silicon containing gas or a mixture that includes silicon containing gas and oxygen gas in an atomic ratio of oxygen to silicon of not greater than about 200; providing power to the electrode to create a plasma of the release layer forming gas within the chamber; and depositing a release layer formed from the release layer forming gas on at least a portion of the first structured surface of the untreated working mold to form a working mold.

Also disclosed is a method of forming a molded article including: placing an untreated working mold on an electrode in a chamber, the untreated working mold having at least a first structured surface and the working mold including a thermoset polymeric material; introducing a release layer forming gas into the chamber, wherein the release layer forming gas includes silicon containing gas or a mixture that includes silicon containing gas and oxygen gas in an atomic ratio of oxygen to silicon of not greater than about 200; providing power to the electrode to create a plasma of the release layer forming gas within the chamber; depositing a release layer formed from the release layer forming gas on at least a portion of the first structured surface of the untreated working mold to form a working mold; and contacting a third generation precursor with at least a portion of the first surface of the working mold to form a molded article that is the inverse of the first structured surface of the working mold.

Articles made using methods as disclosed and exemplified herein are also disclosed.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
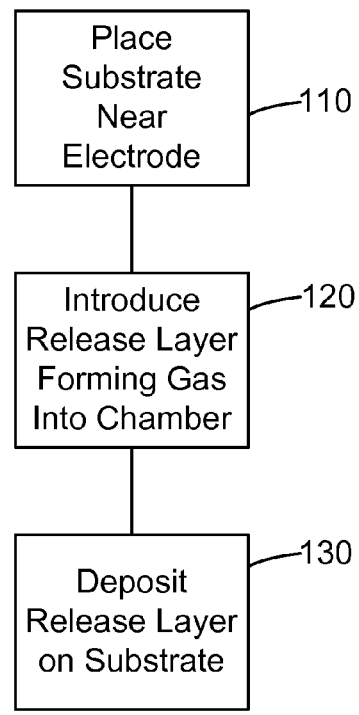
FIG. 1 depicts an embodiment of a method as disclosed herein.

In the following description, reference is made to the accompanying drawings that form a part hereof, and in which are shown by way of illustration several specific embodiments. It is to be understood that other embodiments are contemplated and may be made without departing from the scope or spirit of the present invention. The following detailed description, therefore, is not to be taken in a limiting sense.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

As used in this specification, the term "alkyl" refers to a monovalent group that is a radical of an alkane, which is a saturated hydrocarbon. The alkyl can be linear, branched, cyclic, or combinations thereof and typically has 1 to 20 carbon atoms. In some embodiments, the alkyl group contains 1 to 18, 1 to 12, 1 to 10, 1 to 8, 1 to 6, or 1 to 4 carbon atoms. Examples of alkyl groups include, but are not limited to, methyl, ethyl, n-propyl, isopropyl, n-butyl, isobutyl, tert-butyl, n-pentyl, n-hexyl, cyclohexyl, n-heptyl, n-octyl, and ethylhexyl. The term "alkyl" also includes both substituted and unsubstituted groups.

As used in this specification, the term "alkoxy" refers to a monovalent group of formula —OR where R is an alkyl group.

Disclosed herein are methods of forming a working mold. In an embodiment, a method of forming a working mold includes depositing a release layer on at least a portion of a substrate. Generally, chemical vapor deposition processes can be utilized to deposit a release layer on a substrate. In an embodiment, plasma enhanced chemical vapor deposition (PECVD), or remote plasma enhanced chemical vapor deposition (RPECVD) can be utilized to deposit a release layer on a substrate. Generally, PECVD processes form a plasma using alternating current (AC) or direct current (DC) discharge between two electrodes, with the space between the two electrodes being filled with a reacting gas or gases from which the release layer is ultimately deposited. Any generally utilized system for carrying out PECVD can be utilized herein.

An exemplary PECVD system includes a chamber, also referred to as a reaction chamber. In an embodiment, the chamber can be evacuable, can have means for generating a plasma throughout at least a portion of the chamber and can be capable of maintaining conditions that produce a plasma. That is, the chamber can provide an environment which allows for the control of various conditions, including, but not limited to pressure, the flow rate of one or more gases, the voltage supplied to the powered electrode, the strength of the electric field, formation of a plasma containing reactive species, intensity of ion bombardment and the rate of deposition of a release layer from the reactive species.

In an embodiment, the chamber can be made of aluminum; aluminum has a low sputter yield, therefore very little contamination will generally occur from the surfaces of the chamber. However, other suitable materials, such as graphite, copper, glass or stainless steel, may also be used for the chamber. The chamber can have any suitable volume. In an embodiment, the chamber can have a volume of about 3 feet$^3$. The chamber can have any type of configuration generally utilized. An exemplary PECVD system also includes a powered electrode and a grounded electrode. The two electrodes may be symmetric or asymmetric. In an embodiment one or both electrodes may be cooled, for example, by water. An exemplary, commercially available, system that can be utilized to coat substrates using methods as disclosed herein includes a Plasmatherm PE 2480 (Plasmatherm, Inc., St. Petersburg, Fla.).

An exemplary method as disclosed herein is schematically depicted in FIG. 1. The method includes step 110, placing a substrate near an electrode; step 120 introducing a release layer forming gas into a chamber; and step 130, depositing a release layer on the substrate. One of skill in the art, having read this specification, will understand that other steps (some disclosed herein, some not disclosed herein, or both) can occur before, after, simultaneous with, or in between (or any combination thereof) the steps disclosed in FIG. 1.

The substrate to be coated is placed near an electrode, as depicted in step 110 of FIG. 1. One of skill in the art will understand, having read this specification that placing a substrate near an electrode also includes placing a substrate on an electrode or in contact with an electrode. Contact of the substrate with an electrode is not necessary and if contact is made with the electrode, it does not need to be maintained. In the case of an elongated article, the substrate optionally may be pulled through the chamber continuously. In an embodiment, the substrate to be coated can be placed on the powered electrode or the grounded electrode. In an embodiment, the substrate to be coated is placed on the powered electrode.

Any substrates desired to be coated can be utilized in methods as disclosed herein. In an embodiment, the substrate is polymeric. In an embodiment, the substrate includes a thermoset polymeric material. A thermoset polymeric material is generally one that has undergone a crosslinking reaction that results in a chemical change and an increase in the hardness of the material. Generally, thermoset polymeric materials are infusible, insoluble and resistant to flow upon heating and do not return to their original chemical state upon cooling. A thermoset polymeric material can be formed from a precursor of a thermoset polymeric material, a material that includes crosslinkable materials. Crosslinkable materials need only be crosslinked to form a thermoset polymeric material. Polymerizable materials need to be polymerized and crosslinked to form a thermoset polymeric material. Specific materials that can be utilized as substrates or can be utilized to form substrates are exemplified more fully below.

Generally, substrates that are utilized in methods as disclosed herein and formed using methods disclosed herein can function as a working mold. As used herein, a master mold, or a first generation mold can be utilized to make a working mold (as described below). A working mold can also be referred to herein as a second generation mold or replica of the master mold, which is the first generation mold. A working mold can be used to make a molded article. A molded article can also be referred to as a third generation mold, replica of the second generation mold, or replica of the working mold.

Substrates that are utilized herein can generally have at least one structured surface. The at least one structured surface can generally have a pattern that is the inverse of a pattern or a portion of a pattern that is desired in a molded article. Features that make up the at least one structured surface can generally have dimensions of nanometers to centimeters for example. In an embodiment, features that make up the at least one structured surface can generally have dimensions of nanometers to micrometers.

In an embodiment, features of the working mold can generally have dimensions of about 5 nm to about 1 millimeters. In an embodiment, features of the working mold can generally have dimensions of about 5 nm to about 500 micrometers. In an embodiment, features of the working mold can generally have dimensions of about 100 nanometers to about 500 micrometers. In an embodiment, features of the working mold can generally have dimensions of about 50 nanometers to about 200 micrometers. In an embodiment, features of the working mold can generally have dimensions of about 100 nanometers to about 200 micrometers.

In an embodiment, a working mold can have features that can generally have aspect ratios (ratio of the height to the width) that are less than about 10. In an embodiment, a working mold can have features that can generally have aspect ratios that are less than about 5. In an embodiment, a working mold can have features that can generally have aspect ratios that are less than about 3. In an embodiment, a working mold can have features that can generally have aspect ratios that are less than about 2.

Figure 2A:
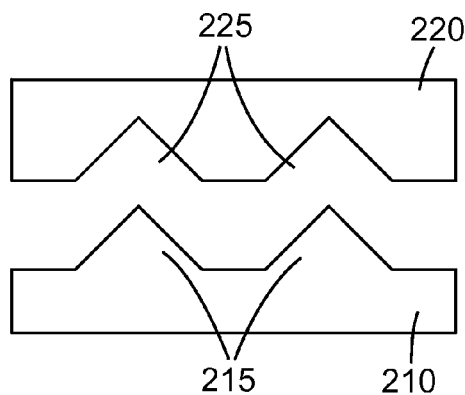
FIGS. 2*a* and 2*b* schematically illustrate a relationship between a master mold, a working mold and a molded article.
Figure 2B:
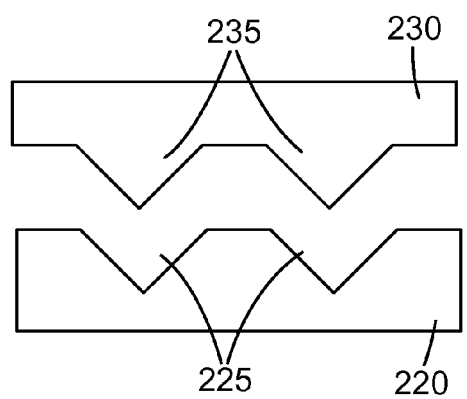

A working mold can be formed using methods and techniques as are generally known to one of skill in the art. One such method includes the use of a master mold or a first generation mold. A master mold can generally have a structured surface that is the inverse of the working mold, or is the same as the pattern or portion of a pattern that is desired to be formed in a molded article. The relationship between a master mold, a working mold, and a molded article is illustrated in FIGS. 2a and 2b. As seen in FIG. 2a, the master mold 210 and a related working mold 220 have patterns that are the inverse of each other. More specifically, the master mold 210 has protrusions 215; and the working mold 220 has corresponding depressions 225. One of skill in the art will understand that the master mold could conversely have depressions and the working mold could have corresponding protrusions. FIG. 2b illustrates the relationship between the working mold 220 and a molded article 230. As seen in FIG. 2b, the working mold 220 has depressions 225 and the molded article 230 has corresponding protrusions 235. One of skill in the art will understand that the working mold could conversely have protrusions and the molded article can have depressions. By comparing the master mold 210 and the molded article 230 (in FIGS. 2a and 2b), it can also be seen that the master mold 210 has substantially the same pattern as the molded article 230.

A master mold can be formed using methods and techniques as are generally known to one of skill in the art. One such method includes initially forming structures, such as a structured array, on a substrate to create a master mold. The structures in the structured array may be designed and arranged using computer aided design and manufacturing (CAD/CAM) software that is known to those of skill in the art. Once the pattern is designed, it can be created in a suitable material by any of a number of processes using commonly utilized techniques, such as, for example, a multiple-photon such as a two-photon exposure process, chemical or mechanical etching, laser ablation, photolithography, stereolithography, micromachining, knurling, cutting, scoring, engraving, diamond turning, and the like. Any process or combination of processes may be used, as long as it can flexibly and controllably provide patterns with structures of a variety of sizes, geometric configurations, surface profiles, or combinations thereof.

The patterns are not generally limited, and may include, for example, protruding structures, recessed structures, continuous and discontinuous grooves, and combinations thereof. The patterns formed by the structures may be regular or irregular, and the individual structures in these patterns may be the same or different in one or more shapes, angles, dimensions or combinations thereof.

The material used to make the master mold can vary widely. In some cases, any material that is sufficiently rigid, flat and stable to allow accurate creation of the structures can be used. In general, a material that is used is one that allows accurate formation and transfer of such structures. Suitable substrate materials include, but are not limited to, metal plates, silicon wafers, glass, quartz or rigid or flexible polymeric materials. In an embodiment where the master mold is formed of a polymeric material, a first generation precursor may be used to form the polymeric material.

Another exemplary method of fabricating a master mold can be found in commonly assigned PCT Publication No. WO 2007137102, entitled PROCESS FOR MAKING LIGHT GUIDES WITH EXTRACTION STRUCTURES AND LIGHT GUIDES PRODUCED THEREBY, filed on May 17, 2007, which is incorporated by reference herein in its entirety.

Once a master mold is formed, it can then be used to form a working mold. Commonly utilized methods for creating working molds from master molds can be utilized herein. The particular method that is used can depend at least in part, on the material that the working mold is made of. In an embodiment where the working mold is to be polymeric, an exemplary method of forming a working mold from a master mold includes contacting a second generation precursor with at least a portion of the master mold. Generally, contacting the second generation precursor with at least a portion of the master mold can function to cover, fill up, or both, at least a portion of the pattern on the master mold. The second generation precursor can then be removed from the master mold by for example, peeling to form a working mold. The working mold will have the reverse image of at least a portion of the pattern on the master mold. The working mold can be, but need not be, self supporting, flexible, or both.

As used herein, a flexible working mold can refer to a working mold that can be removed by peeling it away from the master mold at an angle of at least about 30° (in another embodiment at an angle of at least about 45-70°), measured with respect to a planar surface of the master mold, without significant damage, such as cracking, deformation or altering the structured pattern replicated therein. It should also be noted that the working mold can be removed from the master mold in a parallel fashion, for example if a rigid substrate was attached to the working mold. The working mold may be removed from the master mold by, for example, lifting the working mold around its perimeter or by peeling up one leading edge thereof. The peel rate may vary widely depending on the second generation precursor, the master mold material (in an embodiment formed from the first generation precursor), the density of structures in the master mold as well as other factors. Generally, the higher the density of structures in the master mold, the more slowly the working mold should be removed from the master mold.

In an embodiment, the second generation precursor forms a thermoset polymeric material. A thermoset polymeric material can be formed from a precursor of the thermoset polymeric material, which can also be referred to herein as a second generation precursor in the context of the working mold. The second generation precursor can include crosslinkable materials. The crosslinkable materials can be polymerized, so they need only be crosslinked (i.e., cured) to form a thermoset polymeric material; or the crosslinkable materials can be polymerizable so they need to be polymerized and crosslinked to form a thermoset polymeric material; or the second generation precursor can contain both crosslinkable and polymerizable materials.

In an embodiment, the glass transition temperature (Tg) of the thermoset polymeric material can be about 35° C. or greater. In an embodiment, the glass transition temperature (Tg) of the thermoset polymeric material can be about 45° C. or greater. In an embodiment, the glass transition temperature (Tg) of the thermoset polymeric material can be about 50° C. or greater. In an embodiment, the glass transition temperature (Tg) of the thermoset polymeric material can be about 55° C. or greater.

Exemplary second generation precursors include, but are not limited to, epoxies, melamines, acrylates, alkyd resins, polyurethane precursors, epoxy acrylates and combinations thereof. Exemplary second generation precursors also include thermoplastic polyimides that can be crosslinked to form thermoset polyimides. In an embodiment, the thermoset polymeric material can be derived from polymerizable materials, e.g., monomers that include acrylate groups, epoxy groups, urethane groups, or some combination thereof. In an embodiment, the thermoset polymeric material can be derived from monomers that include hyperbranched acrylates, urethane acrylates, or a combination thereof.

In an embodiment, the second generation precursor has a viscosity that allows it to be contacted with the master mold. In an embodiment, a second generation precursor having a viscosity that does not allow it to be effectively contacted with the master mold could be contacted with the master mold at a temperature that alters the viscosity in a desired fashion. For example, a second generation precursor that has a viscosity that is too high to be easily contacted with the master mold could be contacted at an elevated temperature where the viscosity is decreased to afford more effective contact.

The working mold can also be metallic, glass ceramic, or semiconductive for example. One of skill in the art, having read this specification, would be aware of methods of making working molds using such materials.

The second generation precursor used to form the working mold may optionally be degassed either before or after it is applied to the master mold and following application the material may be polymerized, crosslinked or both by any suitable technique. For example, in an embodiment the second generation precursor may be cured by photochemical or thermal processes. In an embodiment, the second generation precursor may be cured by a source of radiation, such as ultraviolet (UV) radiation. For example, in an embodiment the second generation precursor may be cured by a source of heat that heats the material from room temperature (or the temperature at which it was applied) to a higher temperature. In an embodiment, the higher temperature is a temperature that does not cause damage to the master mold.

In an embodiment, the working mold can have a thickness that is sufficient to form a free-standing film in which the structures from the master mold are accurately replicated. A free-standing film is a film that will retain features formed therein without any additional support, for example from a backing. The working mold thus includes a second pattern that is a reverse image of at least a portion of the pattern in the master mold (e.g., if the master mold includes an array of protruding structures, such as that seen in FIG. 2a, the working mold will have an array of corresponding depressions or indentations, such as that seen in FIG. 2a). In an embodiment, the working mold can be a free-standing film with a thickness of about 2 mm to 1 cm. In an embodiment, the working mold can have a thickness of about 2 mm to about 8 mm. In an embodiment, the working mold can have a thickness of about 2 mm to about 3 mm.

Methods as disclosed herein also include introducing a release layer forming gas into a chamber, step 120 in FIG. 1. As discussed above, PECVD systems that can be utilized herein generally include a chamber, a grounded electrode and a powered electrode. The chamber is generally configured so that gases can be controllably introduced into the chamber. Generally, the gas or mixture of gases that are present during the coating of a substrate is referred to herein as the release layer forming gas.

In an embodiment, the chamber can, but need not, be evacuated before introducing the release layer forming gas, to an extent desired, to remove air and any impurities. This may be accomplished by vacuum pumps, which can be located at a pumping stack connected to the chamber. Inert gases (such as argon) may be introduced into the chamber to alter the pressure with the chamber. Once the chamber is evacuated, the release layer forming gas can be admitted into the chamber via an inlet tube.

The release layer forming gas can be introduced into the chamber at a desired flow rate, which can depend at least in part, on the size of the reactor, the surface area of the electrodes, the porosity of the articles to be treated, the desired thickness of the film, and other factors. The flow rate can generally be chosen as sufficient to establish a suitable pressure at which to carry out the coating, typically 0.13 Pa to 130 Pa (0.001 Torr to 1.0 Torr). For a cylindrical reactor that has an inner diameter of approximately 55 cm and a height of approximately 20 cm, the flow rates are typically from about 50 to about 500 standard cubic centimeters per minute (sccm). At the pressures and temperatures of coating (typically 0.13 to 133 Pa (0.001 to 1.0 Torr) (all pressures stated herein are absolute pressures) and a temperature less than 50° C.), the release layer forming gases generally remain in their vapor form.

In an embodiment, the release layer forming gas can include silicone containing gas. In an embodiment, the release layer forming gas can include a mixture of a silicon containing gas and oxygen. Different and varying amounts of both silicon and oxygen can be utilized as the release layer forming gas. In an embodiment, the atomic ratio of oxygen to silicon in the release layer forming gas is not greater than about 200. The atomic ratio of oxygen to silicon in a release layer forming gas is generally the number of atoms of oxygen introduced into the chamber divided by the number of atoms of silicon introduced into the chamber. For example, in an embodiment where the volumetric flow rate of oxygen ($O_2$—two oxygen atoms) is about 100 times that of the volumetric flow rate of tetramethylsilane (TMS), a silicon containing gas that has one atom of silicon per molecule of TMS, the atomic ratio of oxygen to silicon in this release layer forming gas is about 200. In an embodiment, the atomic ratio of oxygen to silicon in a release layer forming gas is not greater than about 20. In an embodiment, the atomic ratio of oxygen to silicon in a release layer forming gas is about 2 or less. In an embodiment, the atomic ratio of oxygen to silicon in a release layer forming gas is about 0. In this embodiment, the release layer forming gas includes silicon containing gas but no oxygen gas or only a trace amount of oxygen gas.

The amount of oxygen gas, and therefore the atomic ratio of oxygen to silicon can be changed in order to affect the properties of the release layer formed thereby. In an embodiment, higher amounts of oxygen gas generally provide release layers having higher surface energies. Release layers having higher surface energies can be advantageous because it can enhance wetting of the working mold surface by the material being molded (third generation precursor). Better wetting of the working mold surface can generally provide higher fidelity molded articles. Oxygen ($O_2$) can increase the surface tension of the release layer because of the formation of hydroxyl groups on the surface. It should also be noted that surface energies that are too high may cause the force necessary to release molded articles from the surface of the working mold to be too high. Generally, the benefit of wetting and the need for release that are contraindicated properties caused by surface energy can be balanced to determine the desired surface energy.

The atomic ratio of oxygen to silicon can be controlled by controlling the volume or flow rate of the one, two (or more) gases that are introduced into the chamber. In an embodiment, the two (or more) gases can be introduced into the chamber while controlling the flow rates thereof. In an embodiment, the two (or more) gases can be introduced into the chamber while controlling the flow rates thereof to obtain a desired atomic ratio of the two (or more) gases.

In an embodiment, the silicon containing gas can have the formula: $Si(R^a)_3R^b$ wherein $R^a$ is independently H, alkyl, or alkoxy; and $R^b$ is independently H, alkyl, alkoxy, —OSi$(R^a)_3$, or —Si$(R^a)_3$. In an embodiment, all $R^a$ substituents within a single silicon containing gas are the same; and in an embodiment, at least one $R^a$ substituent in a single silicon containing gas is different. In an embodiment, $R^a$ and $R^b$ are the same; and in an embodiment, $R^a$ and $R^b$ are different. In an embodiment, the silicon containing gas is tetramethylsilane (also referred to as "TMS"), $Si(CH_3)_4$; tetraethylorthosilicate (also referred to as "TEOS") $Si(OCH_2CH_3)_4$; hexamethyldisiloxane, $Si(CH_3)_3$—O—$Si(CH_3)_3$; hexamethyldisilane $(CH_3)_3Si$—$Si(CH_3)_3$; silane $SiH_4$; or a combination thereof. In an embodiment, the, silicon containing gas is tetramethylsilane, $Si(CH_3)_4$.

In an embodiment, hydrocarbon compounds can also be included in the release layer forming gas. In an embodiment, the hydrocarbon compound can be an alkane or alkene compound that is a gas at the coating conditions. In an embodiment, the alkane or alkene gas can replace the oxygen gas in the release layer forming gas, and in an embodiment, the alkane or alkene gas can be added to the silicon containing gas and the oxygen. In an embodiment, any hydrocarbon gas that can be introduced into the chamber as a gas can be utilized. In an embodiment, the hydrocarbon compound is a $C_5$ or lower alkane or alkene compound. Exemplary alkane and alkene compounds that can be added include, but are not limited to, butane, propane, pentane, pentene, pentadiene, butene, butadiene, or combinations thereof. The addition of an alkane or alkene compound can, but need not, be utilized to provide the release layer on the working mold with diamond like carbon (DLC) properties. Hydrocarbon compounds. If added to the release layer forming gas (either in place of or in addition to oxygen) can be added in amounts that make the volume percent of silicon containing gas to alkane compound about 10% to about 90%.

Methods as disclosed herein also include a step of depositing a release layer on the substrate, step 130 in FIG. 1. The step of depositing a release layer on the substrate generally includes depositing a release layer from the release layer forming gas using PECVD. Generally, a PECVD process or system forms a plasma and deposits a release layer from that plasma on a surface (or surfaces) within a chamber that houses the plasma. The species within the plasma react on the surface of the working mold. The plasma deposition results in species in the plasma becoming randomly attached to the surfaces of the working mold via covalent bonds. The deposited release layer usually constitutes a full layer over the entire exposed working mold, but may constitute less that a full layer over the entire exposed working mold.

Depositing a release layer on the substrate or working mold can be carried out by providing power to the electrode to form a plasma. Providing power to an electrode to form a plasma can be carried out by, for example, providing a power supply to the electrode and activating the power supply to form a plasma. Generally, the step of providing power to an electrode to form a plasma can occur at any time during the method as disclosed herein. In an embodiment, the step of providing power to an electrode can occur after the substrate is placed near the electrode and after a release layer forming gas is introduced into the chamber.

As discussed above, methods disclosed herein can be carried out in a PECVD system. PECVD systems include a source of power, or are configured to be attached to a source of power. The power that is supplied to the electrode can be an AC or DC source. In an embodiment, the power source is a RF source, for example. Plasma, created from the release layer forming gas introduced into the chamber, is generated and sustained by supplying power.

In an embodiment, the power can be supplied to at least one electrode by an RF generator operating at a frequency in the range of about 0.001 to 100 MHz. In an embodiment, the RF power source provides power at a frequency in the range of about 0.01 to 50 MHz. In an embodiment, the RF power source provides power at a frequency of about 13.56 MHz or any whole number (e.g., 1, 2, or 3) multiple thereof. The RF power source can be an RF generator such as a 13.56 MHz oscillator. In an embodiment, the power source, such as an RF generator, can be operated at a power level of between about 10 Watts and 5000 Watts.

The substrate or working mold to be coated may be placed in, or passed through, the chamber. In some embodiments, a plurality of working molds may be simultaneously or sequentially exposed to the plasma. In an embodiment, the working mold to be coated may be, but need not be, pre-cleaned to remove contaminants that could interfere with the coating. A useful pre-cleaning method is exposure to an oxygen plasma. For this pre-cleaning, pressures in the reactor can be maintained between about 1.3 Pa (10 mTorr) and 27 Pa (200 mTorr). Plasma is generated with RF power levels of between about 500 Watts and 3000 Watts. Other gases may be used for pre-cleaning such as, for example, argon, air, nitrogen, hydrogen or ammonia, or mixtures thereof.

In an embodiment, the film can be deposited by pulsing the power that is supplied to the at least one electrode. Generally, pulsed deposition refers to a process where the RF generator is cycled on and off. In an embodiment, plasma deposition can be performed with a 90% duty cycle of the RF generator, with 90% referring to the amount of time that the RF generator is turned on. The frequency of pulsing may be varied from about 1 Hz to about 100 Hz. In an embodiment, the frequency of pulsing is about 10 Hz. Pulsed plasma deposition can function to decrease or eliminate particle formation that can (but doesn't always) occur during plasma deposition of the release layer, can reduce compressive force of the release layer or a combination thereof.

The release layer that is formed on the substrate, or more specifically working mold, is generally a silicon containing film. In an embodiment, the film can also contain other components. In an embodiment, other components in the release layer forming gas can also modify the silicon containing film. In an embodiment, the film can include amorphous hydrogenated silicon oxycarbide, amorphous hydrogenated silicon carbide, or a combination thereof.

In an embodiment, the release layer has a generally substantially uniform coating thickness over at least a portion of the surface of the working mold. A release layer with a substantially uniform thickness can afford a more uniform molded article. Generally, as release layers become thicker, they can be affected by compression of the release layer itself. Compressive forces on a release layer that is too thick can cause wrinkling in molded articles after extended use of the working mold. In an embodiment, a wrinkled surface of a molded article could provide advantageous properties, for example gain diffusers could benefit from such random substructures. Release layers that are thinner generally don't provide as much benefit as thicker release layers. For example, as the thickness of a release layer is decreased, the durability that is afforded by that release layer can be minimized.

In an embodiment, the release layer is formed on at least a portion of the structured surface of the working mold. In an embodiment, the release layer is formed on substantially the entire surface of the working mold. Generally, larger coverage of the surface of the working mold affords greater advantages from the release layer.

The thickness of a release layer can be estimated by calculation, measurement or both. Generally, the thickness of a release layer is dependent, at least in part, on the deposition rate of the release layer. The deposition rate can be determined using a flat silicon (Si) wafer as a control sample. The thickness on the flat Si wafer can then be determined using, for example, light interference. Once the thickness of the release layer on the Si wafer is determined, the thickness of the release layer on the patterned substrate can be determined by considering the geometry of the pattern. In an embodiment where the working mold has random or complicated structures, calculation of the thickness of the release layer on the patterned surface may be difficult. The thickness of the release layer on the Si wafer in such a situation can provide a usable estimate of the thickness of the release layer on the patterned surface.

In an embodiment, a release layer is generally about 1 nm to about 1000 nm thick. In an embodiment, the release layer is generally about 5 nm to about 300 nm thick. In an embodiment, the release layer is generally about 5 nm to about 100 nm thick. In an embodiment, the release layer is generally about 5 nm to about 50 nm thick. The thickness of the release layer can be controlled, at least in part, by the power supplied to the electrode, the amount of release layer forming gas introduced into the chamber, the time that the working mold is exposed to the plasma, as well as other factors. Generally, the time of deposition is related, often in a linear fashion, to the thickness of the release layer. One of skill in the art, having read this specification, would know the parameters to be controlled, and how to control them in order to obtain the desired release layer thicknesses.

Figure 3:
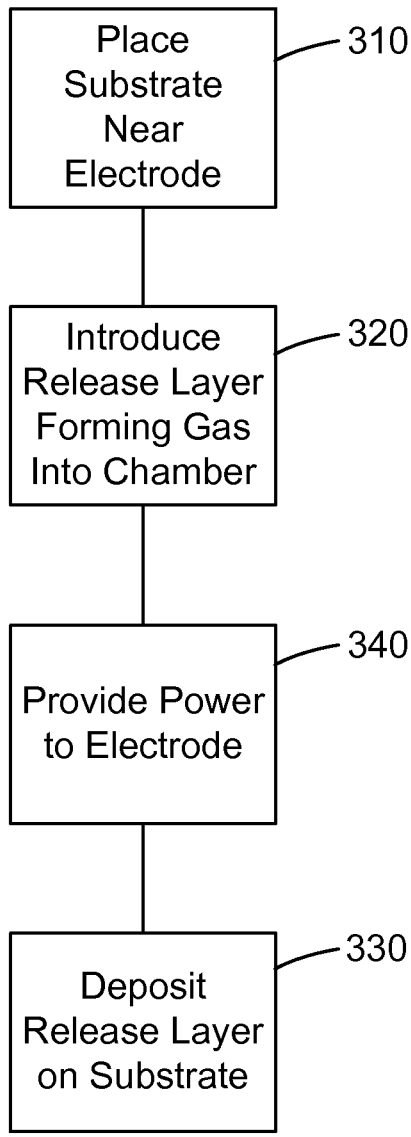
FIG. 3 depicts an embodiment of a method as disclosed herein.

An exemplary method as disclosed herein includes a method as disclosed in FIG. 3. Such a method includes step 310, placing a substrate near an electrode; step 320, introducing a release layer forming gas into a chamber; step 340, providing power to the electrode; and step 330, depositing a release layer on a substrate. Another exemplary method such as this includes placing a substrate on an electrode in a chamber, the substrate having at least a first structured surface and the substrate being a thermoset polymeric material; introducing a release layer forming gas into the chamber, wherein the release layer forming gas includes silicon containing gas or a mixtures of silicon containing gas and oxygen gas in an atomic ratio of oxygen to silicon of not greater than about 200; providing power to the electrode to create a plasma of the release layer forming gas within the chamber; and depositing a release layer formed from the release layer forming gas on at least the first structured surface of the substrate to form a working mold.

Figure 4:
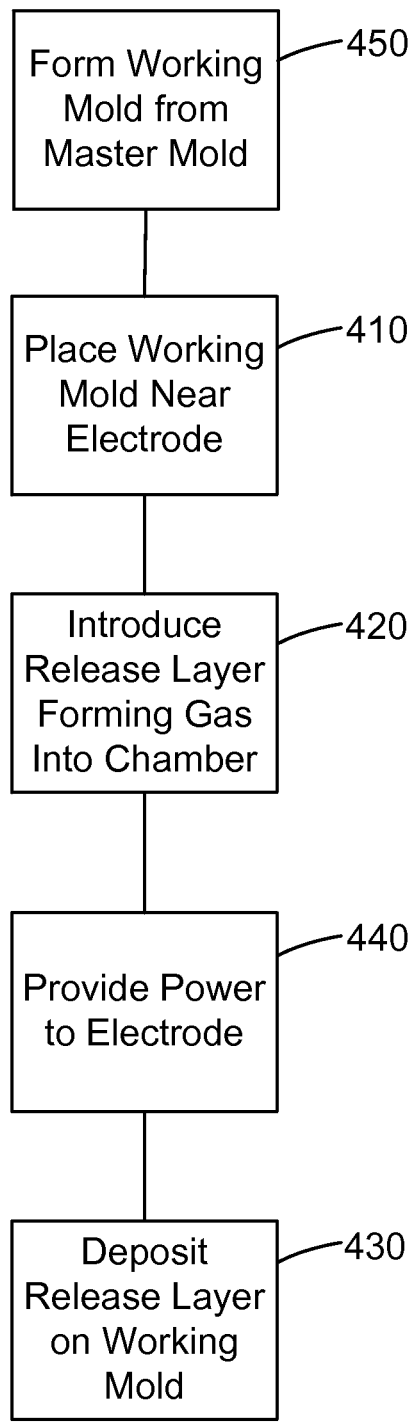
FIG. 4 depicts an embodiment of a method as disclosed herein.

An exemplary method as disclosed herein includes a method as disclosed in FIG. 4. Such a method includes step 450, forming a working mold from master mold; step 410, placing the working mold near an electrode; step 420, introducing a release layer forming gas into a chamber, step 440, providing power to the electrode; and step 430, depositing a release layer on the working mold. Another exemplary methods such as this includes coating at least a portion of a master mold with a second generation precursor that includes crosslinkable material; forming an untreated working mold from the second generation precursor, the untreated working mold having at least a first structured surface and including a thermoset polymeric material; placing the untreated working mold on an electrode in a chamber; introducing a release layer forming gas into the chamber, wherein the release layer forming gas includes silicon containing gas or a mixture of silicon containing gas and oxygen gas in an atomic ratio of oxygen to silicon of not greater than about 200; providing power to the electrode to create a plasma of the release layer forming gas within the chamber; and depositing a release layer formed from the release layer forming gas on at least the first structured surface of the untreated working mold to form a working mold. As used herein, an untreated working mold is generally a working mold before a release layer is formed thereon.

Working molds that are formed using methods as described herein can be utilized to create molded articles. Molded articles formed using working molds as described herein can also be referred to herein as replicas. Methods of forming molded articles include a step of contacting a third generation precursor, in an embodiment a polymeric precursor, with at least a portion of a first surface of the working mold to form a molded article.

Generally, any material that can be used to form an article using a working mold, as described herein, can be brought into contact with at least a portion of the working mold to form a molded article. In an embodiment, the third generation precursor can be a material that can be contacted with the working mold and will or can be hardened. In an embodiment, the third generation precursor can be a material that has a viscosity that allows it to be coated, spread, or contacted with the working mold and will or can be subsequently hardened to form a molded article. In an embodiment, the third generation precursor can be a material that can be contacted with the working mold and will or can be hardened. In an embodiment, the third generation precursor can be a material that has a viscosity that allows it to be coated, spread, or contacted with the working mold and will or can be subsequently hardened to form a molded article. In an embodiment, the material that is contacted, or a third generation precursor can include polymerizable material, polymerized material, or both. The third generation precursor can be one that will form a thermoset polymeric material, a polymerized and crosslinked material; or one that will form a thermoplastic material, polymerized but not crosslinked. In an embodiment, the third generation precursor includes a paste or gel that is hardenable by, for example, drying the hardenable material to remove water or another liquid.

Figure 5A:
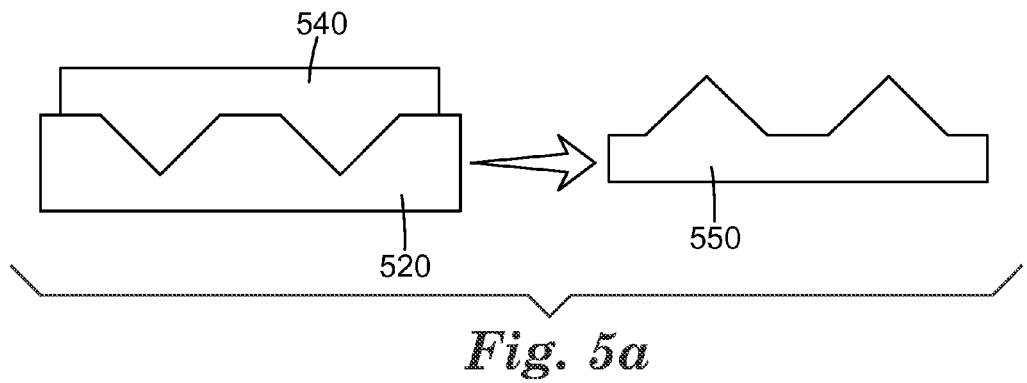
FIGS. 5*a* and 5*b* schematically illustrate steps of making a working mold from a master mold.

The third generation precursor can be brought into contact with the working mold in any fashion generally utilized. In an embodiment, a third generation precursor can be deposited on at least a portion of the working mold. FIG. 5a illustrates such a step. As seen in FIG. 5a, a third generation precursor 540 is applied to at least a portion of the working mold 520. Once the third generation precursor 540 is removed from the working mold 520, as designated by the arrow in FIG. 5a, the third generation precursor forms a molded article 550

Figure 5B:
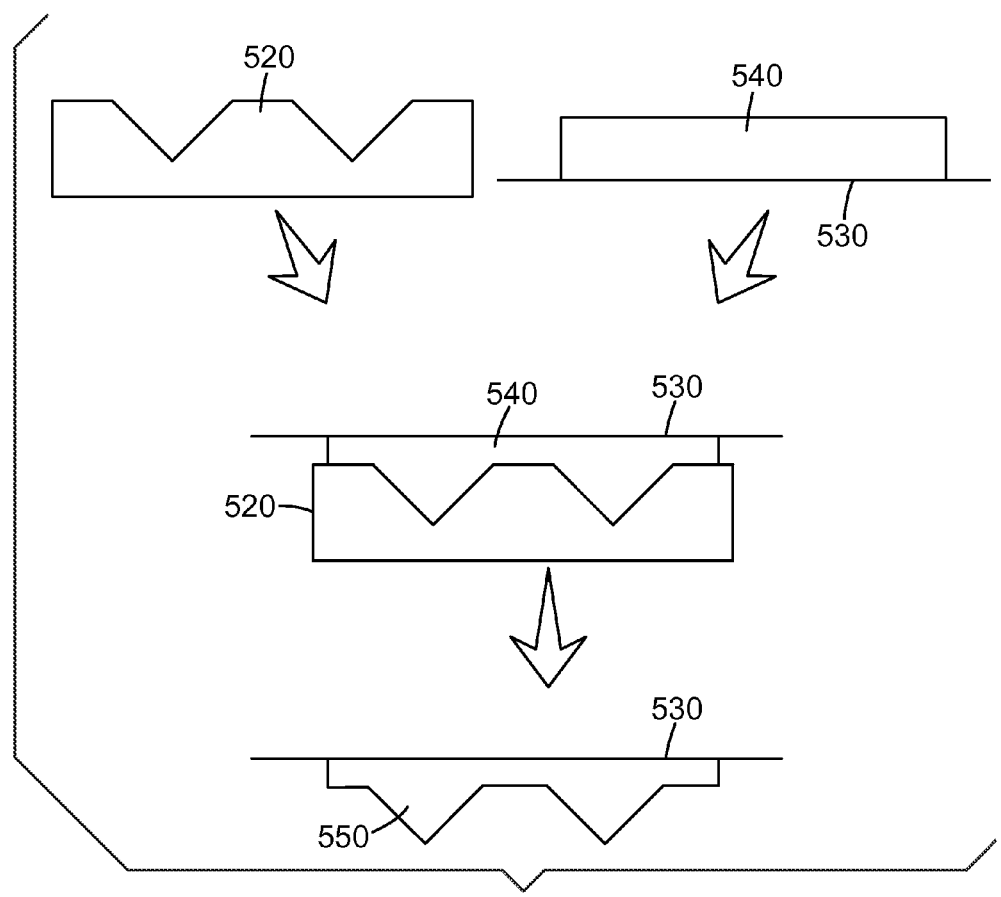

In an embodiment, the third generation precursor can be deposited on at least a portion of a backing and the third generation precursor and the working mold can be brought into contact with one another. FIG. 5b illustrates such a step. As seen in FIG. 5b, a third generation precursor 540 is applied to at least a portion of a backing 530. The backing 530 with the third generation precursor 540 disposed thereon is then brought into contact with the working mold 520, as designated by the double arrows in FIG. 5b, and as shown in the second pane of FIG. 5b. The working mold 520 is then peeled away from the third generation precursor 540, as designated by the single arrow in FIG. 5b, to create a molded article 550 disposed on the backing 530. The backing 530 can either remain in contact with molded article 550 (as shown in FIG. 5b) or can be separated therefrom (not depicted in the figures).

Polymeric precursors (for example a first generation precursor, a second generation precursor or a third generation precursor) as utilized herein can include polymers or monomers. In an embodiment, a third generation precursor can include polymerized material. In an embodiment, the third generation precursor can include polymerizable materials, e.g. monomers or oligomers. In an embodiment, the third generation precursor can include a combination of polymerized and polymerizable material. In an embodiment where the third generation precursor includes monomer, the third generation precursor can be polymerized once contacted with the working mold. In an embodiment where the third generation precursor includes only polymer, the third generation precursor does not need to be polymerized once contacted with the working mold (but in the case of a precursor to a thermoset polymeric material, does need to be crosslinked). The third generation precursor can be, but need not be crosslinkable.

Specific types of third generation precursors that can be utilized can depend, at least in part, on the final molded article that is being made. The third generation precursor can include polymerized, polymerizable or both materials. The molded article can be polymerized only (a thermoplastic molded article), or can be polymerized and crosslinked (a thermoset molded article). Exemplary third generation precursors that can be utilized include, but are not limited to, polycarbonates; polyacrylates such as urethane acrylates and polymethyl methacrylate; polystyrene; silicone polymers, polyolefins, polyimides, and thermoplastic urethanes.

In an embodiment, other components can be added to the third generation precursors before they are brought into contact with the working mold. Generally, such optional components can be added to the third generation precursor to modify one or more properties of the third generation precursor to enhance the formation of a molded article from the working mold. An example of such an optional component includes, but is not limited to, a material that could improve the wetting of the third generation precursor on the working mold. An exemplary material that could be utilized to improve wetting includes a material that could decrease the surface tension of the third generation precursor. Exemplary materials include silicone containing acrylate monomers (at an amount from about 0.3 to 5% by weight of the third generation precursor) and surfactants, such as fluorine containing surfactants for example (e.g. FC4430 (3M Co., St. Paul, Minn.)) (at an amount from about 0.1 to 1% by weight of the third generation precursor; and in an embodiment less than about 0.6% by weight of the third generation precursor).

Methods as disclosed herein can also be done in a continuous fashion. A method that is stated as continuous generally means that the contacting process may be substantially continuous (which means that the process does not stop during the contacting steps used to make the molded articles) or stepwise continuous (their can be some pauses during, before or after contact steps). In an embodiment, substantially continuous methods are utilized.

Examples of stepwise continuous processes include injection molding, resin transfer molding, compression molding and the like. Examples of substantially continuous processes include roll-to-roll processes. In a substantially continuous process, the working mold may be utilized to form a continuous tool. An example of a continuous tool includes a working mold that has been mounted on a rotating drum to create molded articles on a carrier film using a roll-to-roll process. The working mold may also be converted before being placed on a rotating drum (for example) as desired by, for example, cutting to size or shape.

Typical articles made using methods described herein include, for example, prismatic structures for light management films, microfluidic devices, sensors, ring resonators, microneedles for transdermal drug delivery, moth-eye antireflective surfaces and abrasive articles. In an embodiment, methods as disclosed herein can be utilized to manufacture optical materials such as light guides. For example, light guides including microstructures can be fabricated from a wide variety of materials including polycarbonates; polyacrylates such as urethane acrylates and polymethyl methacrylate; polystyrene; silicone polymers, polyolefins, and thermoplastic urethanes. In an embodiment, optically suitable high refractive index materials such as polyacrylates and polycarbonates can be utilized. The exemplary light guides can be especially useful in backlit displays (for example, including a light source, a light gating device (for example, a liquid crystal display (LCD)), and a light guide) and keypads (for example, comprising a light source, an array of pressure-sensitive switches at least a portion of which transmits light, and a light guide). The light guides can also be useful as point to area or line to area back light guides for subminiature or miniature display or keypad devices illuminated with light emitting diodes (LEDs) powered by small batteries. Suitable display devices include, but are not limited to, color or monochrome LCD devices for cell phones, pagers, personal digital assistants, clocks, watches, calculators, laptop computers, vehicular displays, and the like. Other display devices include flat panel displays such as laptop computer displays or desktop flat panel displays. Suitable backlit keypad devices include keypads for cell phones, pagers, personal digital assistants, calculators, vehicular displays, and the like.

Figure 6:
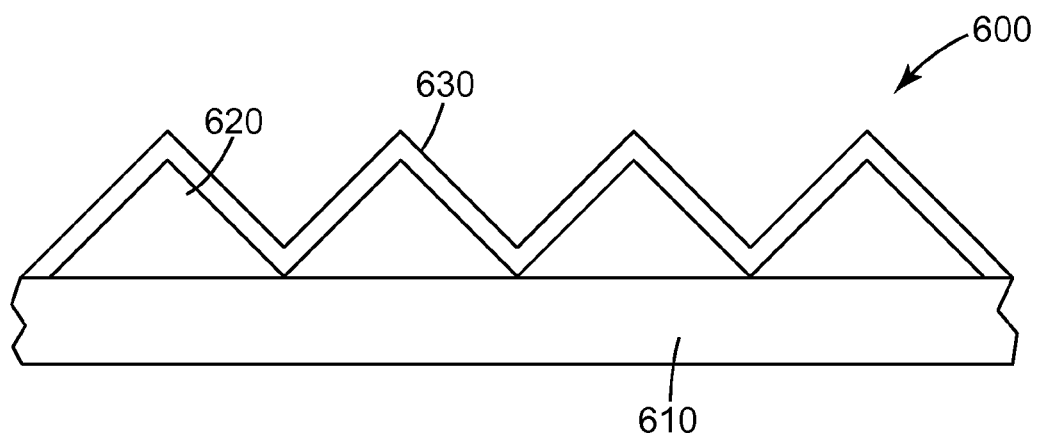
FIG. 6 depicts an exemplary working mold.

FIG. 6 illustrates an exemplary working mold that can be formed using methods disclosed herein. The working mold 600 seen in FIG. 6 includes a mold substrate 610 and a structured surface 620 formed thereon. Although this exemplary working mold includes a mold substrate 610 and structured surface 620 that are two separate pieces, one of skill in the art, having read this specification, will understand that the structured surface could be formed in the substrate material. The exemplary working mold 600 also includes a release layer 630 disposed on the structured surface 620. The substrate 610 and structured surface 620 without the release layer 630 is an example of an untreated working mold.

In an embodiment, a release layer that is deposited on a working mold can function to provide one or more advantageous properties to the working mold or molded articles formed using the working mold. In an embodiment, the release layer can provide the working mold with desired release properties, enhanced durability, the ability to create molded articles having high fidelity and the ability to create molded articles without significant transfer of the working mold or release layer material, for example.

In an embodiment a release layer that is deposited on a working mold can function to provide the working mold with desirable release properties from materials that are contacted therewith (e.g. a third generation precursor) to form a molded article. Release and anti-adhesion are generally used interchangeably throughout. Generally, working molds having good release properties from a molded article are desired. A working mold with good release properties will generally have a low peel force. Peel force measurements can be measured as known by one of skill in the art. An exemplary method of measuring peel force includes use of a Slip/Peel Tester such as a Model SP-2000, commercially available from IMASS, Inc. (Accord, Mass.). Specific parameters surrounding a peel test measurement that can be carried out using a Model SP-2000 Slip/Peel Tester include a peel angle of 180° and a peel rate of 12 inches/minute.

In an embodiment, a working mold has a peel force between the working mold and a molded article of less than about 300 grams/inch. In an embodiment, a working mold has a peel force between the working mold and a molded article of less than about 100 grams/inch. In an embodiment a working mold has a peel force between the working mold and a molded article of less than about 50 grams/inch. In an embodiment, a working mold has a peel force between the working mold and a molded article of less than about 30 grams/inch. In an embodiment, a working mold has a peel force between the working mold and a molded article of less than about 10 grams/inch.

In an embodiment, a working mold formed using a method as disclosed herein has release properties between the working mold and the molded article that do not significantly degrade over time. For example, a working mold can desirably have adhesion between the working mold and the molded article that does not increase over time. This can be an indication of the durability of the working mold. In an embodiment, the peel force between a working mold and the molded article does not increase more than 50% after forming multiple molded articles. In an embodiment, the peel force between a working mold and the molded article does not increase more than 20% after forming multiple molded articles. In an embodiment, forming multiple molded articles an refer to forming at least 10 molded articles.

In an embodiment, the release layer provides a working mold with enhanced durability. The durability of a working mold refers to the ability of the working mold to function to form molded articles and maintain desirable properties with use. Durability of a working mold can be advantageous in all use of working molds to form molded articles, but can be especially advantageous when using working molds in continuous methods. An exemplary method of assessing the durability of a working mold formed using methods herein includes aging experiments. Aging experiments generally accelerate the effects of use on a working mold. One method of simulating such accelerated use is to subject the working mold to elevated temperatures for an extended period of time. For example, a working mold can be subjected to a temperature of about 55° to 70° C. from about 8 hours to about 24 hours. Once the working mold has been subjected to such conditions, molded articles can once again be formed using the working mold (i.e. contacting the working mold with a third generation precursor and curing the third generation precursor), or further peel testing can be carried out on the working mold in order to assess the durability of the working mold. This cycle (time in the oven and formation of a molded article) can be repeated multiple times to simulate aging.

The durability of a working mold can also be monitored in real time, for example, the number of molded articles produced from a working mold, the number of feet of molded articles produced from a working mold (in a continuous method), the number of revolutions the working mold has made (in a continuous method that utilizes the working mold on a roll), or some combination thereof can be monitored. A working mold can be said to be durable for a particular amount of molded articles (either length of molded article produced or revolutions of the working mold, for example) if the working mold, after having produced that particular amount of molded article, can still be effectively utilized to form molded articles (e.g. can be released from a molded article), doesn't show visible signs of fatigue (such as cracking, wrinkling, or transfer to the molded article), or some combination thereof.

In an embodiment, working molds formed using methods as disclosed herein can be utilized in continuous methods for at least about 300 revolutions (when the working mold is used as part of a rotating tool for example). In an embodiment, working molds formed using methods as disclosed herein can be utilized in continuous methods for at least about 1500 revolutions (when the working mold is used as part of a rotating tool for example). In an embodiment, working molds formed using methods as disclosed herein can be utilized in continuous methods for at least about 3000 revolutions (when the working mold is used as part of a rotating tool for example).

In an embodiment, a working mold as disclosed herein affords the ability to create molded articles with high fidelity. Generally, molded articles with high fidelity will be very accurate representations of the working mold that they were formed with. Molded articles having high fidelity are advantageous because the purpose of molding an article is to create an exact replica of the working mold. Generally, high fidelity is affected by the ability of the third generation precursor to be molded to wet the surface of the working mold. The better the third generation precursor can wet the surface, the less likely there are to be air bubbles or voids which can lead to a defect in a molded article. Factors that can influence the fidelity of molded articles include, but are not limited to, the viscosity of the third generation precursor, the wetting of the working mold by the third generation precursor, capillary forces, and combinations thereof. Capillary forces can become increasingly important as the size of the features in the working mold become smaller, in an embodiment, as the features of the working mold approach tens of nanometers. Poor wetting of a working mold by a third generation precursor can, but does not always, lead to molded articles having a rough surface.

In an embodiment, a working mold as disclosed herein affords creation of a molded article with minimal, no measurable transfer, or no transfer of material from the working mold or the release layer deposited on the working mold to the molded article itself. Transfer of the materials making up the working mold or a release layer deposited on the working mold is generally considered to be a disadvantage when forming a molded article. Transferred material can interfere with further processing that can be occurring to the molded article, can create defects in the molded article, can detrimentally affect relevant properties of the molded article, can minimize the durability of the working mold, or a combination thereof.

In an embodiment, a working mold as disclosed herein also generally has good bonding between the working mold and the release layer deposited thereon. This can be important for increasing and/or maintaining durability of the working mold, minimizing transfer from the working mold, or a combination thereof. In general, vapor deposition processes that produce layers using high energy plasma states afford good adhesion between the substrate and the layer deposited thereon.

In an embodiment, working molds as disclosed and formed herein have advantageous stability even when exposed to ultraviolet (UV) radiation. In an embodiment, working molds that are formed as disclosed herein can be used in processes where the third generation precursor is cured using UV light because the working molds are generally stable even upon exposure to UV radiation. This can be advantageous to many processes because the durability of the working mold will not be detrimentally affected by using UV curable molding materials.

In an embodiment, the release layer formed on the working mold can also provide a barrier to stop or minimize third generation precursor from reaching the working mold itself. This can be advantageous because minimizing the amount of third generation precursor that reaches the working mold can enhance the durability of the working mold. The release layer also likely has better adhesion to the mold than a boundary layer would, thereby offering further advantages.

EXAMPLES

Materials and Methods

Unless otherwise noted, all chemicals were obtained from Aldrich and were used without further purification.

A number of examples (noted in the particular examples) utilized 3M® Vikuiti™ Brightness Enhancement Film II (BEF-II90/24) as a working mold on which to form various release layers. The BEF-II90/24 has prisms with a 90° angle and a 24 micrometer pitch. The particular Vikuiti™ Brightness Enhancement Film II that were utilized herein had either a 2 mil (referred to herein as "thin BEF") or a 5 mil polyethylene terephthalate (PET) backing (referred to herein as "BEF").

Plasma coating was carried out using a Plasmatherm PE 2480 system (Plasmatherm, Inc. St. Petersburg, Fla.). Coating thicknesses were measured using Ocean Optics' USB-2000 equipment (via light interference) with a flat Si wafer as a reference substrate. The flat thickness of the film on the BEF is the measurement, and therefore the thickness of the film (taking into consideration the structure of the BEF) can be calculated as the flat thickness/$\sqrt{2}$.

A number of examples (noted in the particular examples) utilized "Resin 1" as the material which was disposed on the working mold to form a polymeric article. Resin 1 was a 3:1 ratio (wt %) of PHOTOMER® 6210 aliphatic urethane diacrylate (Cognis Corp., Ambler Pa.) and SR238 1,6 hexanediol diacrylate (HDDA) (Sartomer Company, Inc., Exton, Pa.) with 1% IRGACURE® 819 photoinitiator (Ciba Specialty Chemicals, Basel, SWITZERLAND).

A number of examples (noted in the particular examples) utilize primed PET films. The primed PET film referred to herein is a 2 mil polyethylene terephthalate (PET) film available as PET #618 from DuPont (DuPont Wilmington, Del.).

The working molds were utilized to form a molded article by applying a resin (second generation precursor) to the working mold, covering the resin coated working mold with a primed PET film (as discussed above) and then applying pressure to the primed PET film to spread the resin and remove any air bubbles. The resin was then cured (except where noted otherwise) using a Fusion UV Systems, Inc. UV curing system (Fusion UV Systems, Inc., Gaithersburg, Md.). A hydrogen (H) or deuterium (D) bulb was utilized at 600 Watts and the web speed was set at 20 feet/minute (fpm).

Aging was simulated by the following protocol. The unitary structure of the working mold, resin and primed PET film was placed in an oven set at about 55° C. to 70° C. for a set amount of time, for example typically 8 to 24 hours. The resin was then UV cured (as discussed above) and the molded article was peeled off of the working mold. Carrying out these steps (placing the unitary structure in the oven, UV curing and removing the molded article) once is referred to as one cycle. An overall aging time refers to the total time that unitary structures including a single working mold were in the oven, which was not necessarily accomplished through the use of multiple similar oven times, but could have been accomplished through the use of multiple different oven times.

Peel force measurements were carried out on aged samples. Generally, a working mold that was about 8×10 inches had resin applied thereto, was covered with a primed PET film and was cured as discussed above. After UV curing, a one inch strip was cut from the structure parallel to the BEF line direction. The peel force was then measured with a model SP-2000 Slip/Peel Tester (IMASS, Inc. Accord, Mass.). The peel angle for the testing was 180° degree and the peel rate was 12 inch/min.

Comparative Example 1 (C1)

Resin 1 was spread about 30 micrometers thick, on a BEF film and then covered with a primed PET film. Pressure was applied to the PET film in order to spread the monomer and remove any air bubbles. The sample was then UV cured. After UV curing, the replica could not be separated from the original BEF film.

Examples 1a, 1 and 2

BEF films (about 5×7 inches) were primed with argon gas at a flow rate of 250 standard $cc^3$/min (SCCM), a pressure of 25 mTorr and RF power of 1000 Watts for 30 seconds. Subsequently, the samples were exposed to tetramethylsilane (TMS) and oxygen plasma at a TMS flow rate of 50 SCCM and an $O_2$ flow rate of 500 SCCM; this corresponds to an atomic ratio of oxygen to silicon of about 20. The pressure in the chamber was 55 mTorr and the RF power was set at 1000 Watts. Table 1 below shows the duration of plasma coating and the atomic ratio of oxygen to silicon for the release layers in Examples 1a, 1 and 2.

The deposition rate was measured to be about 1.1 nm/second on a flat surface using an Si wafer. The thickness of the release layer on the BEF surfaces can be calculated using the thickness on the flat surface. As discussed above, BEF has right triangles on the surface thereof. Each of the sides of the prisms therefore have a length that is ½($\sqrt{2}$); therefore implying that the BEF has a surface area that is 2×½($\sqrt{2}$) or 1.414× flat area (without the prisms). Therefore, the thickness of the film on BEF is equal to the flat thickness (measured using the Si wafer) divided by 1.414.

TABLE 1

| Example Number | Duration (seconds) | Atomic ratio of oxygen/silicon | Thickness (nanometers) |
|---|---|---|---|
| 1a | 5 | 20 | 4 |
| 1 | 10 | 20 | 8 |
| 2 | 20 | 20 | 16 |

Figure 7:
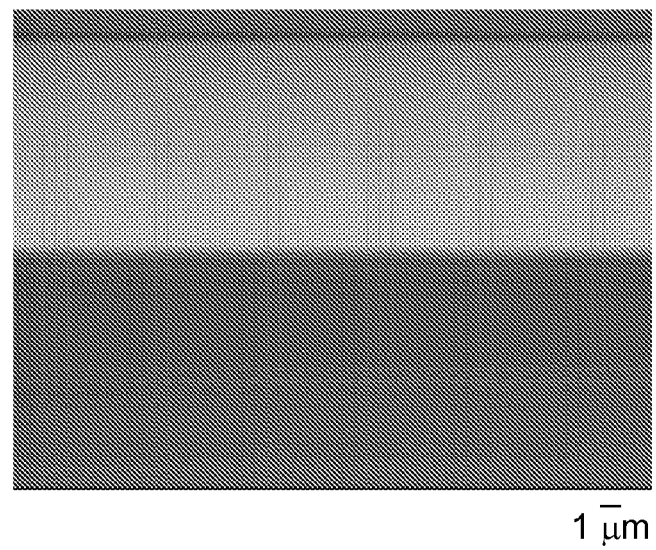
FIG. 7 shows a scanning electron micrograph of a molded article made using a working mold as described in Example 1.

The coated working molds were then mounted on an aluminum plate using Teflon tape (3M #5490) or Green tape (3M #8403) and Resin 1 was coated and cured on the mold as discussed above. Resin 1 in these examples was coated on the working molds at a thickness of about 30 micrometers. After UV curing, the molded article on the primed PET film was peeled off of the working mold. The molded articles were easily released from both working molds. FIG. 7 shows a typical scanning electron micrograph (SEM) of a replica (top view).

Two other samples (prepared as in Examples 1 and 2) were aged as discussed above. Both samples showed good release for the cured resin even after 200 hours of aging. The peel force data for Example 1 is shown in Table 2 below.

TABLE 2

| Example Number | Atomic ratio of Oxygen/Silicon | Thickness of Film (nanometers) | Initial Peel force (grams/inch) | Peel force after aging 72 hours at 54° C. (grams/inch) |
|---|---|---|---|---|
| 1 | 20 | 8 | 4.0 g/in | 4.2 g/in |
| 3 | 2 | 14 | 8.2 g/in | 3.6 g/in |
| 4 | 0 | 26 | 7.3 g/in | 5.5 g/in |
| C1 | None | 0 | No release. PET broken. | No release. PET broken. |

Surface roughness of the working molds and a molded article formed from the working molds of Examples 1a, 1 and 2 were measured by Tapping Mode Atomic Force Microscopy, The results are summarized in Table 3 below.

TABLE 3

| Example Number | Root Mean Square (RMS) Surface Roughness (nanometers) | Standard Deviation (nanometers) |
|---|---|---|
| Thin BEF (no release layer) | 4.2 | 0.1 |
| Example 1a (4 nm release layer) | 4.7 | 0.3 |
| Example 1 (8 nm release layer) | 4.7 | 0.3 |
| Example 2 (16 nm release layer) | 5.6 | 0.3 |
| 5th molded article from Example 1 working mold | 5.9 | 0.3 |

Example 3

BEF films (about 5×7 inches) were primed with argon gas at a flow rate of 250 standard cc$^3$/min (SCCM), a pressure of 25 mTorr and RF power of 1000 Watts for 30 seconds. Subsequently, the samples were exposed to tetramethylsilane (TMS) and oxygen plasma at a TMS flow rate of 150 SCCM and an $O_2$ flow rate of 150 SCCM; this corresponds to an atomic ratio of oxygen to silicon of about 2. The pressure in the chamber was 50 mTorr and the RF power was set at 1000 Watts. The release layer was deposited for about 10 seconds. The flat surface deposition rate for this example was measured to be about 2 nm/second, resulting in a release layer thickness of 14 nm. Replication and aging experiments were carried out as discussed above. Good release was observed after aging for over 200 hours (UV cured for 10-12 times). The peel testing values are reported in Table 2 above.

Examples 4-7

BEF films (about 5×7 inches) were primed with argon gas at a flow rate of 250 standard cc$^3$/min (SCCM), a pressure of 25 mTorr and RF power of 1000 Watts for 30 seconds. Subsequently, the samples were exposed to tetramethylsilane (TMS) plasma at a TMS flow rate of 150 SCCM but no added oxygen; this corresponds to an atomic ratio of oxygen to silicon of about 0. The pressure in the chamber was 25 mTorr and the RF power and duration time are as shown in Table 4 below. The thickness was measured and calculated as explained in Example 1 above.

TABLE 4

| Example Number | Power (Watts) | Duration (seconds) | Thickness (nanometers) |
|---|---|---|---|
| 4 | 1000 | 10 | 26 |
| 5 | 2000 | 10 | 42 |
| 6 | 1000 | 60 | 150 |
| 7 | 2000 | 60 | 255 |

All of the working molds showed a flat surface (without wrinkles) after plasma coating. The replication and aging experiments were carried out as discussed above. Good release was observed after aging for over 200 hours (UV cured for 10-12 times) for all samples. Peel testing was carried out (as discussed above) on Example 4. The results can be seen in Table 2 above. The molded articles from Example 6 and 7 showed wrinkled surfaces (sub-micron size) after aging. This is believed to be due to the compressive stress in the plasma deposited TMS films.

Example 8

BEF films (about 5×7 inches) were primed with argon gas at a flow rate of 250 standard cc$^3$/min (SCCM), a pressure of 25 mTorr and RF power of 1000 Watts for 30 seconds. Subsequently, the samples were exposed to tetramethylsilane (TMS) and oxygen plasma at a TMS flow rate of 50 SCCM and an $O_2$ flow rate of 500 SCCM; this corresponds to an atomic ratio of oxygen to silicon of about 20. The pressure in the chamber was 50 mTorr and the RF power was set at 1000 Watts. Table 5 below shows the duration of plasma coating for Examples 8a, 8b and 8c.

BEF films (about 5×7 inches) were primed with argon gas at a flow rate of 250 standard cc$^3$/min (SCCM), a pressure of 25 mTorr and RF power of 1000 Watts for 30 seconds. Subsequently, the samples were exposed to tetramethylsilane (TMS) plasma at a TMS flow rate of 150 SCCM but no added oxygen; this corresponds to an atomic ratio of oxygen to silicon of about 0. The pressure in the chamber was 25 mTorr and the RF power and duration time are as shown in Table 5 below (Example 8d).

TABLE 5

| Example Number | Duration (seconds) | Thickness (nanometers) |
|---|---|---|
| 8a | 10 | 8 |
| 8b | 20 | 16 |
| 8c | 30 | 24 |
| 8d | 10 | 26 |

The coated films were then cut using a paper cutter (to trim the edges) to form working molds. The working molds were taped on a 12 inch diameter Cr finish metal roll (pre-heated to about 55° C.) using 3M® #8403 green tape (with silicone adhesive and polyethylene backing, 58 um thickness). Resin 1 was utilized for replication and a primed PET film was used as a backing. The web speed was changed from 20 ft/min (first 3000 ft); to 40 ft/min (3000 ft to 5000 ft); and finally to 60 ft/min (last 5,000 ft). A total of 10,000 feet was run using each of the four molds (about 3300 revolutions).

X-ray photoelectron spectroscopy (XPS, or ESCA) was employed to study the surface compositions of the working molds and molded articles of Example 8. The results are summarized in Table 6. The results indicate that the plasma deposited release layers are very durable and that there was no Si transfer (or was below the detection limit −0.5 atomic %) observed to the molded articles.

TABLE 6

| Example Number | % Atomic Si on Surface (Before Use) | % Atomic Si on Surface (After 1,000 Revolutions) | % Atomic Si on Surface (After 3,000 Revolutions) |
|---|---|---|---|
| 8a | 33 | 31 | 30 |
| 8b | 38 | 33 | 32 |
| 8c | 40 | 35 | 33 |
| 8d | 22 | 20 | 21 |

Example 9

A BEF film (about 5×7 inches) was primed with argon gas at a flow rate of 250 standard cc$^3$/min (SCCM), a pressure of 25 mTorr and RF power of 1000 Watts for 20 seconds. Subsequently, the sample was exposed to tetramethylsilane (TMS) and oxygen plasma at a TMS flow rate of 10 SCCM and an O$_2$ flow rate of 1000 SCCM; this corresponds to an atomic ratio of oxygen to silicon of about 200. The pressure in the chamber was 15 mTorr, the RF power was set at 1000 Watts and the sample was exposed for 30 seconds. The plasma coating in this example was pulsed at a 10 Hz, 90% duty cycle. The working mold was aged and used to replicate as discussed above. Good release and good replication was observed after 200 hours of aging (UV cured 5 times in between).

Example 10

A structured polyimide, which was cut by excimer laser ablation to have a pattern of inverse cones from a 5 mil polyimide H film (DuPont Wilmington, Del.) was utilized in this example. The cones had an angle of about 60°, a diameter of about 40 micrometers and a height of about 35 micrometers. The mold was primed with argon gas at a flow rate of 250 standard cc$^3$/min (SCCM), a pressure of 25 mTorr and RF power of 1000 Watts for 30 seconds. Subsequently, the samples were exposed to tetramethylsilane (TMS) and oxygen plasma at a TMS flow rate of 50 SCCM and an O$_2$ flow rate of 500 SCCM. The pressure in the chamber was 55 mTorr and the RF power was set at 1000 Watts, the working mold was exposed for about 20 seconds. The release layer that was formed was 16 nm thick. The working mold (about 5×7 inches) was then cut using a paper cutter (to trim the edge). The cut working mold was taped on a 12 inch diameter Cr finish metal roll (pre-heated to about 55° C.) using 3M® #8403 green tape. Resin 1 was utilized for replication and a primed PET film was used as a backing. The web speed was about 50 feet per minute. A total of 1600 feet was run using the mold (about 500 revolutions). Good release and good replication was observed.

Example 11

A nickel (Ni) master mold having hexagonally close packed convex structures with a diameter of about 100 micrometers and a height of about 25 micrometers was utilized to form a working mold. Resin 1 was applied to the 5 mil PET backing and UV cured against the Ni master mold. The cured resin was peeled from the Ni master mold to form the working mold. The working mold had hexagonally close packed concave structures with a diameter of about 100 micrometers and a height of about 25 micrometers.

The working mold (about 5×7 inches) was primed with argon gas at a flow rate of 250 standard cc$^3$/min (SCCM), a pressure of 25 mTorr and RF power of 1000 Watts for 30 seconds. Subsequently, the sample was exposed to tetramethylsilane (TMS) and C$_4$H$_6$ plasma at a TMS flow rate of 150 SCCM and an C$_4$H$_6$ flow rate of 200 SCCM. The pressure in the chamber was 40 mTorr, the RF power was set at 2000 Watts and the sample was exposed for 10 seconds. The coated sample was then aged and used to replicate as discussed above.

The coated mold was then cut using a paper cutter to form a mold. The mold was taped on a 12 inch diameter Cr finish metal roll using 3M® #8403 green tape. The metal roll was heated to a temperature of 68° C. to begin molding. A resin containing 65 weight percent bisphenol-A epoxy diacrylate (SR349 from Sartomer), 20 weight percent phenoxyethyl acrylate (SR339 from Sartomer) and 15 weight percent trimethylolpropane triacrylate (SR351 from Sartomer), and 0.5 weight percent (based on weight of resin) Darocur 1173 photoinitator from Ciba Geigy Chemicals was utilized for replication and a primed PET film was used as a backing. The web speed was 80 feet/min. A total of 6000 feet was run using the mold (about 2000 revolutions). Good release was achieved and the replicas showed a smooth surface with high fidelity.

Thus, embodiments of methods of forming molds and methods of forming molded articles using such molds are disclosed. One skilled in the art will appreciate that the present disclosure can be practiced with embodiments other than those disclosed. The disclosed embodiments are presented for purposes of illustration and not limitation, and the present disclosure is limited only by the claims that follow.

What is claimed is:

1. A method of forming a molded article comprising:
    placing an untreated working mold on an electrode in a chamber, the untreated working mold having at least a first structured surface and the working mold comprising a thermoset polymeric material;
    introducing a release layer forming gas into the chamber, wherein the release layer forming gas is a silicon containing gas or a mixture consisting of a silicon containing gas and oxygen gas in an atomic ratio of oxygen to silicon is not greater than about 2;
    providing power to the electrode to create a plasma of the release layer forming gas within the chamber;
    depositing a release layer formed from the release layer forming gas on at least a portion of the first structured surface of the untreated working mold to form a working mold;
    forming a rotating tool comprising the working mold; and
    contacting a third generation precursor with at least a portion of the first surface of the working mold to form a molded article that is the inverse of the first structured surface of the working mold, wherein the third generation precursor is deposited on a backing and is brought in contact with the rotating tool using a roll-to-roll process.

2. The method of claim 1, wherein the release layer has a thickness in a range of 5 to 100 nanometers.

3. The method of claim 1, wherein the silicon containing gas comprises Si(R$^a$)$_3$R$^b$ wherein
    R$^a$ is independently H, alkyl, or alkoxy;
    R$^b$ is independently H, alkyl, alkoxy, —OSi(R$^a$)$_3$, or —Si(R$^a$)$_3$, where R$^a$ is as defined above.

4. The method of claim 1, wherein the silicon containing gas comprises $Si(CH_3)_4$, $Si(OCH_2CH_3)_4$, $Si(CH_3)_3-O-Si(CH_3)_3$, $(CH_3)_3Si-Si(CH_3)_3$, $SiH_4$, or a combination thereof.

5. The method of claim 1, wherein the silicon containing gas comprises $Si(CH_3)_4$.

6. The method of claim 1, wherein the release layer forming gas is a mixture of $Si(CH_3)_4$ and oxygen.

7. The method of claim 1, wherein the thermoset polymeric material has a Tg of about 35° C. or greater.

8. The method of claim 1, wherein the first structured surface has features with dimensions of 5 nanometers to 1 millimeter.

9. The method of claim 1, wherein the first structured surface has features with an aspect ratio (ratio of height to width) less than 10.

10. The method of claim 1, wherein the wherein the release layer forming gas is $Si(CH_3)_4$.

* * * * *

UNITED STATES PATENT AND TRADEMARK OFFICE
CERTIFICATE OF CORRECTION

PATENT NO. : 9,102,083 B2  
APPLICATION NO. : 12/675217  
DATED : August 11, 2015  
INVENTOR(S) : David et al.

Page 1 of 1

It is certified that error appears in the above-identified patent and that said Letters Patent is hereby corrected as shown below:

Title Page, item (56)

Page 3, Column 1 (Other Publications)
Line 3, Delete "Polymetylmethacrylate" and insert -- Polymethylmethacrylate --, therefor.

Page 3, Column 1 (Other Publications)
Line 17, Delete "Lithigraphy"" and insert -- Lithography" --, therefor.

In the Specification

Column 12
Line 62, Delete "article 550" and insert -- article 550. --, therefor.

Column 22
Line 23-24, Delete "photoinitator" and insert -- photoinitiator --, therefor.

In the Claims

Column 23
Line 17, In Claim 10, delete "wherein the wherein the" and insert -- wherein the --, therefor.

Signed and Sealed this
Twelfth Day of April, 2016

Michelle K. Lee
*Director of the United States Patent and Trademark Office*